United States Patent [19]

Nojiri et al.

[11] Patent Number: 4,836,888

[45] Date of Patent: Jun. 6, 1989

[54] METHOD OF CHEMICALLY ETCHING SEMICONDUCTOR SUBSTRATE

[75] Inventors: Hidetoshi Nojiri; Ryuta Hirayama, both of Yokosuka, Japan

[73] Assignee: Nissan Motor Co., Ltd., Yokohama, Japan

[21] Appl. No.: 194,943

[22] Filed: May 17, 1988

[30] Foreign Application Priority Data

Jul. 23, 1987 [JP]  Japan .................. 62-182287

[51] Int. Cl.$^4$ .............. H01L 21/306; B44C 1/22; C03C 15/00; C03C 25/06
[52] U.S. Cl. ................. 156/647; 156/653; 156/657; 156/659.1; 156/662; 204/129.65; 252/79.1; 437/225
[58] Field of Search ............. 156/626, 647, 653, 657, 156/659.1, 662; 437/65, 66, 72, 225, 234; 252/79.1; 204/129.1, 129.65

[56] References Cited

U.S. PATENT DOCUMENTS

4,765,865 8/1988 Gealer et al. .................. 156/647

*Primary Examiner*—William A. Powell
*Attorney, Agent, or Firm*—Foley & Lardner, Schwartz, Jeffery, Schwaab, Mack, Blumenthal & Evans

[57] ABSTRACT

In a method of etching a semiconductor substrate to a desired depth from the principal surface is a selected area or selected areas by immersing the semiconductor substrate with a patterned mask such as oxide film in an etching liquid such as hydrated hydrazine, an electrode is formed on a surface of the semiconductor substrate in an area separated from the area(s) to be etched before immersing the substrate in the etching liquid. The material of the electrode is chemically stable and insusceptible to reaction with the etching liquid. In the disclosed etching method, a cathodic reduction reaction takes place on the aforementioned electrode while an anodic oxidation reaction, which causes anodic dissolution of the semiconductor material, takes place in the exposed area(s) of the semiconductor substrate. Therefore, etching is not obstacled by precipitation of the material once dissolved in the etching liquid, so that the new surface provided by etching is excellen in flatness.

5 Claims, 1 Drawing Sheet

METHOD OF CHEMICALLY ETCHING SEMICONDUCTOR SUBSTRATE

BACKGROUND OF THE INVENTION

This invention relates to a method of etching a semiconductor substrate to a desired depth from the principal surface in a selected area or selected areas by immersing the semiconductor substrate with a patterned mask in an etching liquid.

In producing semiconductor devices it is often necessary to etch at least one selected area of a semiconductor substrate to a desired depth from the principal surface by immersing the semiconductor substrate in an etching liquid after providing the substrate with a mask having a window for each area to be etched.

For example, a semiconductor substrate using a single crystal of silicon so as to make its (100) crystal plane the principal surface of the substrate is etched in 100% hydrated hydrazine. In advance of immersing into the etching liquid, a silicon oxide film is formed on each side of the semiconductor substrate by a heat treatment in an oxidizing atmosphere, and by a photo-etching process the oxide film on the top surface is removed in the area(s) where the substrate is to be etched.

In this method, etching is accomplished by using oxidation-reduction reactions between the etching liquid and the exposed surface of the semiconductor substrate. That is, etching proceeds as silicon in the exposed area of the substrate is oxidized by hydrazine and dissolves in the hydrated hydrazine as silicon ions. This is the phenomenon called anodic dissolution. However, the etching process is complicated by a cathodic reduction reaction which accompanies the anodic oxidation dissolution reaction. Since etching proceeds under a mixed potential condition imposed by the oxidation and reduction reactions, there is a strong tendency toward formation of local cells within the area to be etched, and the local cells become a serious cause of local nonuniformity of reactions. More particularly, while etching by the anodic dissolution is proceeding in some regions of the etching area of the semiconductor substrate, a reduction reaction preferentially takes place in other regions of the same area to cause precipitation of a portion of silicon dissolved in the etching liquid. Consequently, a number of tiny pyramid-shaped projections, each of which has surfaces of (111) crystal planes, appear in the new surface provided by the etching process, so that the flatness of the new surface is significantly marred.

A conventional technique to cope with the above described problem is addition of a suitable quantity of reaction buffering additive such as water, surfactant or alcohol to the 100% hydrated hydrazine used as etching liquid. However, the addition of such an additive lowers the etch rate with a resultant lowering of productivity of the semiconductor device manufacturing process. Another known measure is optimizing the environmental conditions of etching such as the rate of stirring of the etching liquid and the temperature of the etching liquid. However, even when such conditions are optimized it is inevitable that the above described pyramid-shaped projections are formed as the concentration of dissolved matter in the etching liquid increases as progresses.

SUMMARY OF THE INVENTION

It is an object of the present invention to provide an improved etching method, which belongs to the above described method of immersing a semiconductor substrate in an etching liquid to accomplish etching by an anodic dissolution reaction and can smoothly and efficiently accomplish desired etching with excellent flatness of the new surface provided by etching.

The present invention provides a method of etching a semiconductor substrate in at least one selected area by immersing the semiconductor substrate in an etching liquid to cause oxidation-reduction reactions between the semiconductor substrate and the etching liquid. According to the invention, this method comprises the step of forming an electrode on a surface of the semiconductor substrate in an area separate from the selected area(s) to be etched before immersing the semiconductor substrate in the etching liquid. The material of the electrode is chemically stable and insusceptible to reaction with the etching liquid.

In the etching method according to the invention, the electrode formed in an area not to be etched serves the function of separating a cathodic reduction reaction from an anodic oxidation reaction in the area(s) to be etched. That is, in this etching method a cathodic reduction reaction takes place exclusively on the electrode provided by the invention while preferentially and almost exclusively an anodic oxidation reaction which causes anodic dissolution takes place in the exposed area(s) of the semiconductor substrate surface. Therefore, local cells are not formed in the etching area(s) and accordingly the etching proceeds smoothly without formation of the above described pyramid-shaped projections on the etched surface. In consequence, etching is accomplished with good uniformity and high precision, and the new surface provided by etching is excellent in flatness.

DESCRIPTION OF THE PREFERRED EMBODIMENTS

An example of the etching method according to the invention is described with reference to FIGS. 1(A) to 1(D).

Figure 1A:
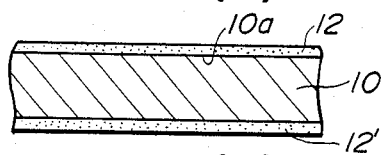
FIGS. 1(A) to 1(D) are schematic and fragmentary sectional views of a semiconductor substrate, respectively, illustrating steps of an etching method as an example of the invention.

FIG. 1(A) shows a single crystal silicon semi-conductor substrate 10 as the object of etching. The silicon semiconductor may be of either p-type or n-type, and the (100) crystal plane of the single crystal silicon is made the surface 10a of the substrate 10. The surface 10a is covered with a silicon oxide film 12, and the opposite surface is also covered with a silicon oxide film 12'. These oxide films 12, 12' are formed each to a thickness of about 500 nm by heat treatment of the silicon semiconductor substrate 10, for example, in a humidified oxidizing atmosphere at a temperature of about 1100° C. for about 40 min.

Figure 1B:
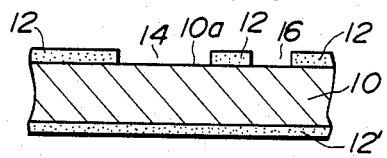

Referring to FIG. 1(B), by a conventional photo-etching method the oxide film 12 is removed in a selected area 14 where the semiconductor substrate 10 is to be etched and also in another area 16 where an electrode according to the invention is to be formed. That is, in these areas 14 and 16 the semiconductor substrate surface 10a is exposed. The area 16 is at some distance from the area 14 and is separated from the area 14 by a remaining part of the oxide film 12. The thus selectively etched oxide film 12 is used as a patterned mask in the subsequent etching operation.

Figure 1C:
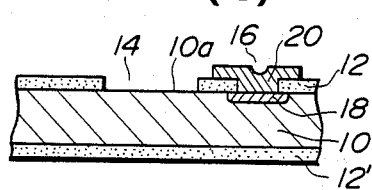

Referring to FIG. 1(C), a platinum film (20) is formed by a suitable method such as vacuum evaporation on the etched oxide film 12, and then a photo-etching operation is performed to leave the platinum film 20 only in the area 16. The platinum film 20 in this area 16 is to be used as an electrode. Optionally and in advance of forming the electrode 20, an impurity of the same type as the one used in the semiconductor substrate 10 is diffused into the substrate 10 to form a high-concentration impurity diffused layer 18 only in the area 16. The purpose of forming this diffused layer 18 is decreasing the contact resistance between the platinum film 20 and the semiconductor substrate 10.

Figure 1D:
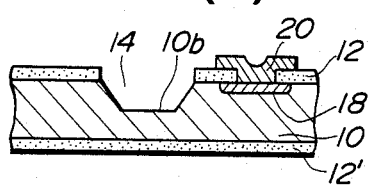

After performing the above preparatory operations, the semiconductor substrate 10 in the state shown in FIG. 1(C) is immersed in an etching liquid such as 100% hydrated hydrazine to etch the semiconductor substrate 10 in the area 14 by using the remaining part of the oxide film 12 as a mask. In the etching liquid the silicon semiconductor substrate 10 exposed in the area 14 is oxidized. That is, gradually silicon dissolves as silicon ions into the etching liquid. This is anodic dissolution. As a result the silicon semiconductor substrate 10 is etched in the area 14 as shown in FIG. 1(D). During the etching process the electrons liberated by ionization of silicon move through the body of the semiconductor substrate 10 and reach the electrode 20 formed of the platinum film, and on the surface of this electrode 20 hydrogen ions in the etching liquid are reduced by the electrons. That is, on this electrode 20 a cathodic reduction reaction takes place. Thus, in this etching method the area 14 of the semiconductor substrate 10 and the platinum film 20 act as anode and cathode, respectively. Therefore, in the area 14 preferentially and almost exclusively an anodic dissolution reaction takes place without formation of local cells which prevent smooth etching. In consequence, a new surface 10b provided by this etching method maintains good flatness.

Figure 2A:
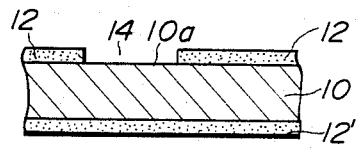
FIGS. 2(A) to 2(C) are schematic and fragmentary sectional views of a semiconductor substrate, respectively, illustrating steps of a conventional etching method and a problem in the result.
Figure 2B:
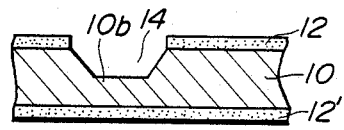
Figure 2C:
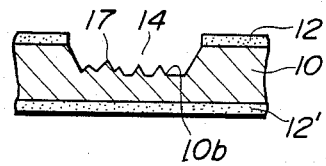

For comparison, FIGS. 2(A) to 2(C) illustrate etching of the same semiconductor substrate 10 without using the present invention.

FIG. 2(A) corresponds to FIG. 1(B). In this case the oxide film 12 is removed only in the area 14 where the silicon semiconductor substrate 10 is to be etched. In the state shown in FIG. 2(A) the semiconductor substrate 10 is immersed in the etching liquid (100% hydrated hydrazine). As shown in FIG. 2(B), the semiconductor substrate 10 is etched in the area 14 as a consequence of the above described anodic oxidation reaction. However, in this case the above described cathodic reduction reaction too takes place within the area 14. That is, a portion of silicon dissolved in the etching liquid again precipitates on the etched surface of the semiconductor substrate 10. Therefore, the new surface 10b provided by the etching operation is not flat in a microscopic sense. As illustrated in FIG. 2(C), the surface 10b is formed with a number of tiny pyramid-shaped projections 17 each of which has surfaces given by the (111) crystal planes of single crystal of silicon.

Figure 3A:
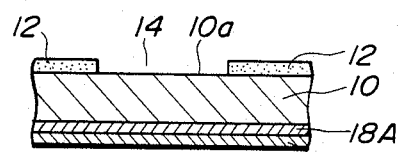
FIGS. 3(A) and 3(B) show a modification of the steps illustrated by FIGS. 1(B) to 1(D) in another example of the invention.
Figure 3B:
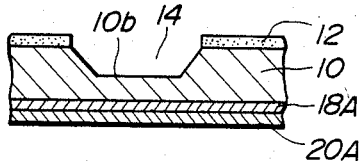

FIGS. 3(A) and 3(B) illustrate another example of the present invention. The semiconductor substrate 10 to be etched and the oxide film 12 formed on the surface 10a are as described in the foregoing example with reference to FIG. 1(A). However, the oxide film 12' on the opposite surface is omitted in this example. Instead, a platinum film 20A is formed over the entire area of the bottom surface of the semiconductor substrate 10. In this example this platinum film 20A is used as an electrode according to the invention. Optionally and in advance of forming the platinum film 20A, a high-concentration impurity diffused region 18A, which corresponds to the diffused region 18 in FIG. 1(C), is formed in the bottom surface layer of the semiconductor substrate 10 to decrease contact resistance between the platinum film 20A and the semiconductor substrate 10. The oxide film 12 is removed only in the area 14 where chemical etching is to be made.

In the state shown in FIG. 3(A), the semiconductor substrate 10 is immersed in the etching liquid. As illustrated in FIG. 3(B), etching is accomplished in the area 14 as a consequence of anodic dissolution of silicon into the etching liquid. The electrons liberated by ionization of silicon move through the body of the substrate 10 and arrive at the platinum film 20A on the opposite surface. Therefore, cathodic reduction reaction takes place on this platinum film 20A, not on the etched semiconductor substrate surface in the area 14. Consequently the etching proceeds very smoothly, and the new surface 10b provided by the etching is excellent in flatness.

The manner of forming the electrode 20A in this example is favorable for reducing the contact resistance between the electrode film 20A and the semiconductor substrate 10 since the area of contact of the electrode film with the substrate can be made very large. Besides, the process of forming the electrode 20A is simplified since there is no need for pattern transfer by photo-etching.

Either of the above described two examples of the invention can easily be incorporated in a process for mass production of semiconductor devices since formation of the electrode film 20 or 20A can be accomplished by operations usual in a conventional process of producing a semiconductor device, such as by a combination of vacuum evaporation and photo-etching for instance.

The material of the electrode 20 or 20A is not limited to platinum. It is possible to use any other conductive material that does not react with the etching liquid. Only by way of example, gold, tantalum and carbon are named, besides platinum, as electrode materials suitable for use in this invention.

What is claimed is:

1. In a method of etching a semiconductor substrate in at least one selected area by immersing the semiconductor substrate in an etching liquid to cause oxidation-reduction reactions between the semiconductor substrate and the etching liquid, the improvement comprising the step of forming an electrode on a surface of the semiconductor substrate in an area separate from any of said at least one selected area, wherein said electrode is a film formed on the semiconductor surface subjected to etching and is separated from any of said at least one selected area by an oxide film previously formed on the same surface before immersing the semiconductor substrate in the etching liquid, the material of said electrode being chemically stable and insusceptible to reaction with the etching liquid.

2. A method according to claim 1, further comprising the step of forming a high-concentration impurity diffused layer in a surface region of the semiconductor substrate before forming said electrode such that said electrode makes direct contact with said diffused layer.

3. In a method of etching a semiconductor substrate in at least one selected area by immersing the semiconductor substrate in an etching liquid to cause oxidation-reduction reactions between the semiconductor substrate and the etching liquid, the improvement comprising the step of forming an electrode on a high-concentration impurity diffused layer previously formed in a rear surface region of the semiconductor substrate opposite to the surface subjected to etching before immersing the semiconductor substrate in the etching liquid, the material of said electrode being chemically stable and insusceptible to reaction with the etching liquid.

4. A method according to claim 1, wherein the material of said electrode is selected from the group consisting of platinum, gold, tantalum and carbon.

5. A method according to claim 1, wherein said semiconductor substrate is a silicon semiconductor substrate, said etching liquid being hydrated hydrazine.

* * * * *